United States Patent [19]
Gladden et al.

[11] Patent Number: 5,155,451
[45] Date of Patent: Oct. 13, 1992

[54] CIRCUIT AND METHOD FOR DYNAMICALLY GENERATING A CLOCK SIGNAL

[75] Inventors: Michael E. Gladden; William P. LaViolette, both of Austin, Tex.

[73] Assignee: Motorola, Inc., Schaumburg, Ill.

[21] Appl. No.: 835,834

[22] Filed: Feb. 18, 1992

[51] Int. Cl.⁵ .......................... H03L 7/06; H03L 7/18
[52] U.S. Cl. ..................... 331/1 A; 328/14; 331/8; 331/14; 331/18; 331/116 FE
[58] Field of Search ............... 331/1 A, 14, 18, 25, 331/8, 116 FE; 328/14

[56] References Cited

U.S. PATENT DOCUMENTS 4,244,043 1/1981 Fujita et al. ............... 331/14 X
4,931,748 6/1990 McDermott et al. .......... 331/1 A

OTHER PUBLICATIONS

"MC68332 User's Manual" published by Motorola, Inc. in 1990, Section 4, pp. 4-4 to 4-53.

Primary Examiner—Siegfried H. Grimm
Attorney, Agent, or Firm—Jonathan P. Meyer

[57] ABSTRACT

A clock generator (30) dynamically generates a system clock in response to a high or a low frequency oscillator. An amplified oscillator input is provided to a first input of a multiplexor (62), a divider (56), and a comparator circuit (58, 60). Divider (56) divides an oscillator input frequency to provide a divided input to a second input of multiplexor (62). Comparator circuit (58,60) compares the input frequency with a reference frequency to determine whether the input frequency is high or low. If the input frequency is low, multiplexor (62) is enabled to provide the oscillator input as the system clock. If the input frequency is high, multiplexor (62) provides the divided input as the system clock. Additionally, comparator circuit (58,60) provides a control signal to enable an amplifier (50) to amplify the oscillator input using a high or low gain factor in accordance with the input frequency.

21 Claims, 5 Drawing Sheets

CIRCUIT AND METHOD FOR DYNAMICALLY GENERATING A CLOCK SIGNAL

FIELD OF THE INVENTION

This invention relates generally to a data processing system, and more particularly to a clock generator in a data processing system.

BACKGROUND OF THE INVENTION

Phase lock loop circuits are well known in the prior art as clock generators which provide stable clock signals having predetermined, stable frequencies. The stability of each frequency is provided as a result of an iterative process which uses a feedback path to compare an output of the phase lock loop circuit with an input signal typically provided by a crystal oscillator. Many variations of the phase lock loop circuit have been developed to provide improvements over known technology. For example, U.S. Pat. No. 4,931,748 provides a circuit and a method for determining when the input signal provided by the crystal oscillator is no longer present. If the oscillator input to the phase lock loop circuit is not detected, a special reference signal is provided to enable the phase lock loop circuit to continue to provide the stable clock signal.

Although phase lock loop circuits have been substantially improved, several basic limitations still exist. For example, the locking time, or the period of time required for a phase lock loop circuit to provide a stable signal after system start-up, is limited by both a frequency and an amplitude of the oscillator input signal. An oscillator input signal with a lower frequency generally requires more time to provide a signal having a detectable amplitude. Therefore, more time must pass before the oscillator is able to provide a stable signal. When an oscillator with a frequency of thirty-two kilohertz is used, a maximum locking time of several seconds may be required to provide a stable system clock. In many applications, this delay is unacceptable. An oscillator with a higher frequency may be used to decrease the locking time to an acceptable period. However, when an oscillator with a higher frequency is used, the power consumption of the entire system is increased.

Therefore, a need exists for a phase lock loop circuit which decreases locking times for a low frequency oscillator, but still uses a minimal amount of power. Additionally, a user should not be limited to a single input frequency, but should be provided with the flexibility of using one of a plurality of frequencies depending on an application of the system in which the phase lock loop circuit is implemented. For example, the user may choose between a phase lock loop circuit which either consumes relatively little power, decreases locking times for an external oscillator, or both.

SUMMARY OF THE INVENTION

The previously mentioned needs are fulfilled with the present invention. Accordingly, there is provided, in one form, an integrated circuit clock signal generator for receiving a first reference signal at a first frequency and a second reference signal at a second frequency. The integrated circuit clock signal generator provides a first clock signal. The integrated circuit clock signal generator includes an amplifier for receiving and amplifying the first reference signal to provide an amplified signal. A first logic circuit is coupled to the amplifier for processing the amplified signal to provide a second clock signal having a third frequency. The integrated circuit clock signal generator also includes a control circuit. The control circuit has a first input for receiving the second reference signal and a second input for receiving the amplified signal. The control circuit processes each of the amplified signal and second reference signal to provide a first control signal. A selector is coupled to the amplifier means, the first logic circuit, and the control circuit for providing the first clock signal at either the first frequency or the third frequency in response to the first control signal.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

The present invention provides a phase lock loop circuit and method of operation which provide fast locking times with minimal power consumption. Additionally, the clock generator described herein allows a user to derive a predetermined system clock signal using one of a plurality of oscillators, each of which provides a different frequency. The present invention allows the user to simply supply a different oscillator to the input of the phase lock loop circuit and does not require additional software or hardware control inputs. Therefore, a user is provided with an uniquely flexible phase lock loop circuit which dynamically determines an oscillator input frequency and subsequently provides a system clock signal with a minimal amount of power consumption depending on a frequency of the oscillator input.

The terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

Figure 1:
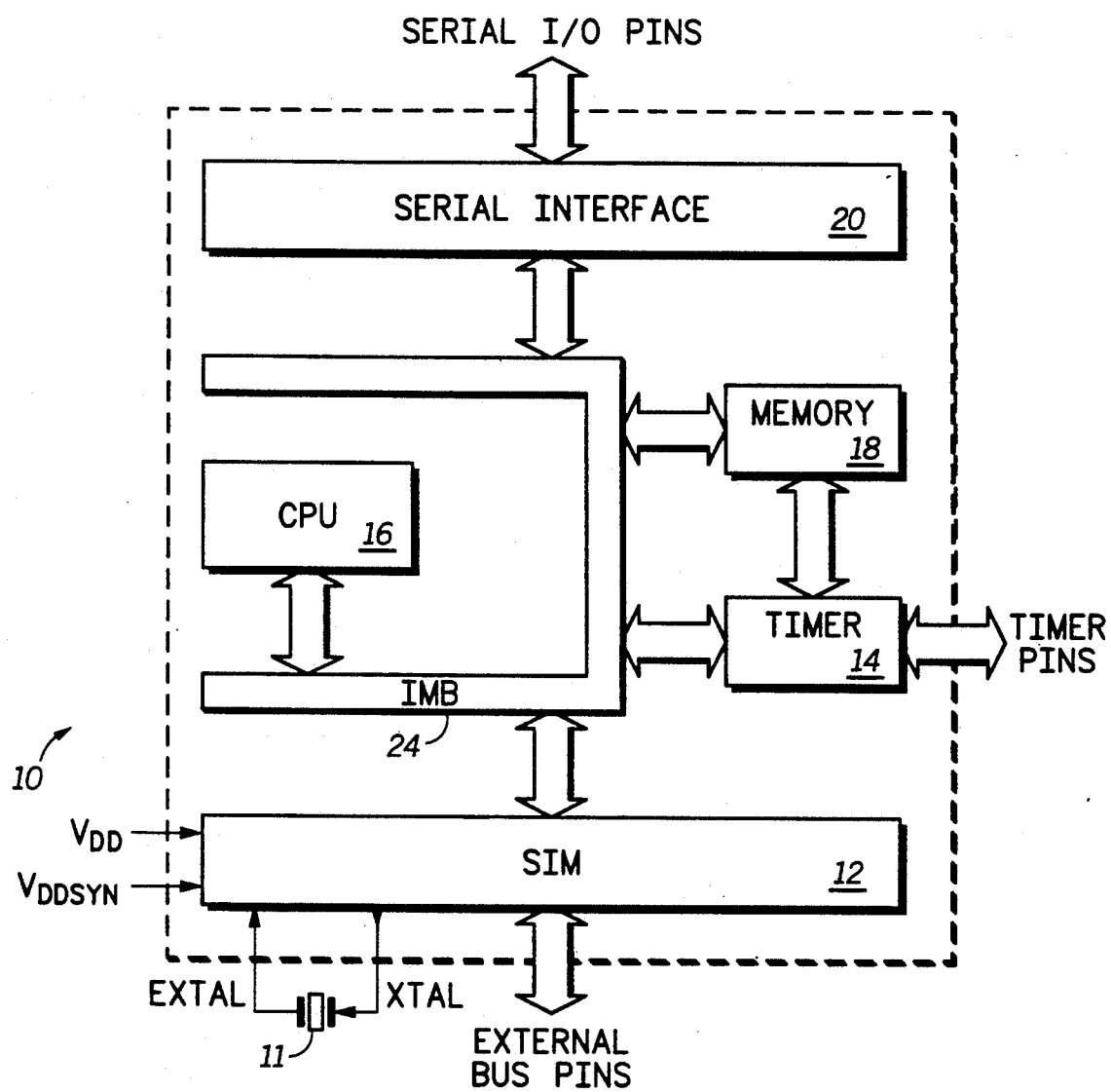
FIG. 1 illustrates in block diagram form an integrated circuit data processor in accordance with one embodiment of the present invention.

FIG. 1 illustrates one implementation in which the clock generator circuit described herein may be used. In this embodiment, the clock generator circuit provides a system clock to an integrated circuit data processor 10.

Data processor 10 generally includes a oscillator crystal 11, a System Integration Module (SIM) 12, a timer circuit 14, a Central Processing Unit (CPU) 16, a memory circuit 18, serial interface 20, and an Inter-Module Bus (IMB) 24. SIM 12, timer circuit 14, CPU 16, memory circuit 18, and serial interface 20 are each bi-directionally coupled to IMB 24 to communicate a plurality of address, data, and control signals. Additionally, memory 18 is bi-directionally coupled to timer circuit 14 to communicate data and control information. Serial interface 20 is bi-directionally coupled to an external data processor (not shown) via a plurality of serial input/output (I/O) pins to receive a first plurality of external information. Similarly, both timer circuit 14 and SIM 12 are bi-directionally coupled to external devices (not shown) via a plurality of timer pins and a plurality of external bus pins, respectively. SIM 12 also receives a $V_{DD}$ signal and a $V_{DDSYN}$ signal to respectively provide a power supply to data processor 10. Oscillator crystal 11 receives a signal labelled "XTAL" from and provides a signal labelled "EXTAL" to SIM 12.

During operation, SIM 12 generates a plurality of clock signals necessary for both data processor 10 and all peripheral devices coupled to the plurality of external bus pins to function correctly together. The $V_{DDSYN}$ signal is used to provide a separate power supply to a clock generator in SIM 12 such that noise and interference problems are reduced. Chapter 4 of the MC68332 User's Manual published by Motorola, Inc. of Austin, Tex. in 1990, describes some of the conventional functions performed by SIM 12. However, the MC68332 User's Manual does not describe the unique functionality of SIM 12 as described herein.

Figure 2:
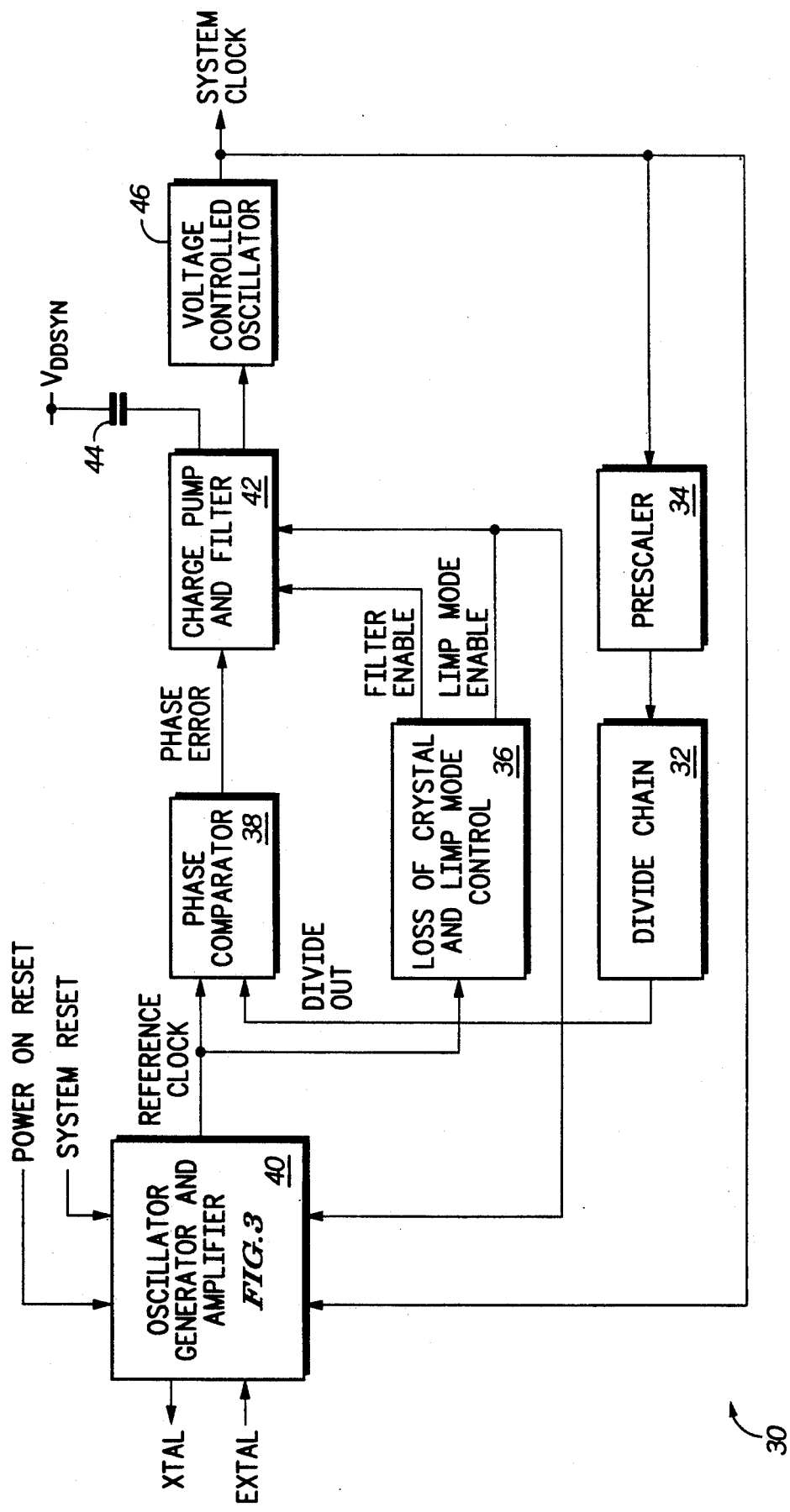
FIG. 2 illustrates in partial block diagram form a clock generator of the data processor of FIG. 1.

FIG. 2 illustrates in partial block diagram form a clock generator 30 of data processor 10 of FIG. 1. This circuit, as previously mentioned, is located within SIM 12. Clock generator 30 generally includes a divide chain 32, a prescaler 34, a Loss of Crystal and Limp Mode Control circuit 36, a phase comparator 38, an oscillator generator and amplifier 40, a charge pump and filter 42, a capacitor 44, and a Voltage Controlled Oscillator (VCO) 46.

During operation, the EXTAL signal is provided to an input of oscillator generator and amplifier 40. Additionally, the XTAL signal is output to oscillator crystal 11. Generation of the XTAL signal is well known to one of ordinary skill in the art. Oscillator generator and amplifier 40 provides, as will be more fully described below, a "REFERENCE CLOCK" signal to a first input of phase comparator 38 in response to each of a "Power On Reset" (POR) signal, a "SYSTEM RESET" signal, and a "SYSTEM CLOCK" signal. The REFERENCE CLOCK signal is also provided to an input of Loss of Crystal and Limp Mode Control circuit 36. The POR and SYSTEM RESET signals respectively provide a first and second control input to oscillator generator and amplifier circuit 40. Both the POR and SYSTEM RESET signals are asserted when data processor 10 is powered up or reset. The POR signal is only asserted for a brief period of time at system start-up or reset, whereas the SYSTEM RESET signal is asserted for a longer period of time to ensure proper system operation. Additionally, the SYSTEM RESET signal may be asserted by a user of data processor 10 at any point during operation that the user determines data processor 10 should be reset.

Divide chain 32 provides an "DIVIDE OUT" signal to a second input of phase comparator 38. Phase comparator 38 compares a frequency of each of the REFERENCE CLOCK and DIVIDE OUT signals and provides a "PHASE ERROR" signal to an input of charge pump and filter 42.

Loss of Crystal and Limp Mode Control circuit 36 provides a "FILTER ENABLE" signal and a "LIMP MODE ENABLE" signal to a first and a second control input of charge pump and filter 42. Basically, Loss of Crystal and Limp Mode Control circuit 36 indicates when the EXTAL signal is no longer provided to clock generator 30 and a special clock signal should be provided to enable clock generator 30 to continue to provide the SYSTEM CLOCK signal. U.S. Pat. No. 4,931,748 discusses an implementation of the Loss of Crystal and Limp Mode Control circuit 36 in greater detail and is hereby incorporated herein by reference.

If the FILTER ENABLE signal is asserted, charge pump and filter 42 filters the PHASE ERROR signal and provides a filtered output at a first voltage level to VCO 46. Similarly, if the LIMP MODE ENABLE signal is asserted, a first logic circuit (not shown) in charge pump and filter 42 charges and discharges capacitor 44 to provide a stable second voltage level to VCO 46. When either the FILTER ENABLE or LIMP MODE ENABLE signals are asserted, capacitor 44 and a resistor (not shown) in charge pump and filter 42 function to provide an RC filter circuit. The RC filter circuit ensures that the output provided to VCO 46 is stable and does not reflect transients in the PHASE ERROR signal. Additionally, in this implementation of the claimed invention, both the FILTER ENABLE and the LIMP MODE ENABLE signals may not be simultaneously asserted. Circuitry necessary to charge and discharge capacitor 44 is well-known to one of ordinary skill in the art and is, therefore, not explained in detail herein.

Upon receipt of either the filtered output or the limp mode frequency, VCO 46 provides the SYSTEM CLOCK signal to both external circuitry in data processor 10 and to the plurality of peripheral devices coupled to the plurality of external bus pins. A frequency of the SYSTEM CLOCK signal is determined by a voltage level of the input of VCO 46. For example, assume the PHASE ERROR signal indicates that the frequency of the REFERENCE CLOCK signal is greater than the frequency of the DIVIDE OUT signal. Therefore, when the PHASE ERROR signal is filtered and provided to VCO 46, VCO 46 will increase the frequency of the SYSTEM CLOCK signal. The SYSTEM CLOCK signal is then scaled by prescaler 34 and divided to a lower frequency by divide chain 32 to attempt to match the frequency of the REFERENCE CLOCK signal. Similarly, if the frequency of the REFERENCE CLOCK signal is less than the frequency of the DIVIDE OUT signal, the filtered PHASE ERROR signal will enable VCO 46 to decrease the frequency of the SYSTEM CLOCK signal.

In addition to providing the SYSTEM CLOCK signal to external circuitry, VCO 46 also provides the SYSTEM CLOCK signal to prescaler 34 and to a second oscillator input of oscillator generator and amplifier 40. Prescaler 34 scales the SYSTEM CLOCK signal and provides a scaled clock signal to an input of divide chain 32. Divide chain 32 subsequently divides the scaled clock signal by a predetermined frequency to provide the DIVIDE OUT signal at a lower frequency. As was previously stated, the DIVIDE OUT signal is provided to phase comparator 38.

As is illustrated in FIG. 2, clock generator 30 uses feed-back to control the frequency of the SYSTEM CLOCK signal provided to external circuitry. The frequency of the SYSTEM CLOCK signal is partially determined by the REFERENCE CLOCK signal provided by oscillator generator and amplifier 40. In this embodiment of the invention, the REFERENCE CLOCK signal typically has a frequency of thirty-two kilohertz, an industry standard operating frequency. Typical implementations of clock generators have been developed to provide a predetermined clock frequency using an EXTAL signal with a set frequency. However, the locking time of clock generator 30 is dependent on the frequency of the EXTAL signal. For example, if the EXTAL signal has a frequency of thirty-two kilohertz, the locking time required to provide a stable SYSTEM CLOCK signal with a minimal amount of power consumption is typically several seconds, a relatively long period of time in a microprocessing environment. Similarly, if the EXTAL signal has a frequency of four megahertz, the SYSTEM CLOCK signal is provided in a relatively quick period of time of fifty milliseconds. However, the faster the frequency of the EXTAL signal, the more power a clock generator will consume. Therefore, a system designer must typically choose between quick locking times or low power consumption when designing a data processing system using conventional clock generator circuitry.

Clock generator 30 allows more flexibility than traditional phase lock loop implementations. Oscillator generator and amplifier 40 allows a user to determine whether a fast or slow oscillator will be used to provide the EXTAL signal. In particular, in the implementation of the invention described herein, the user may provide either a thirty-two kilohertz or a four megahertz oscillator to provide the EXTAL signal. Therefore, a user may choose a four megahertz oscillator for faster locking times or a thirty-two kilohertz oscillator for lower system power consumption. Additionally, oscillator generator and amplifier 40 allows a user to gain faster locking times during a system start-up of clock generator 30 without using a four megahertz oscillator. For further details of oscillator generator and amplifier 40, refer to FIG. 3.

Figure 3:
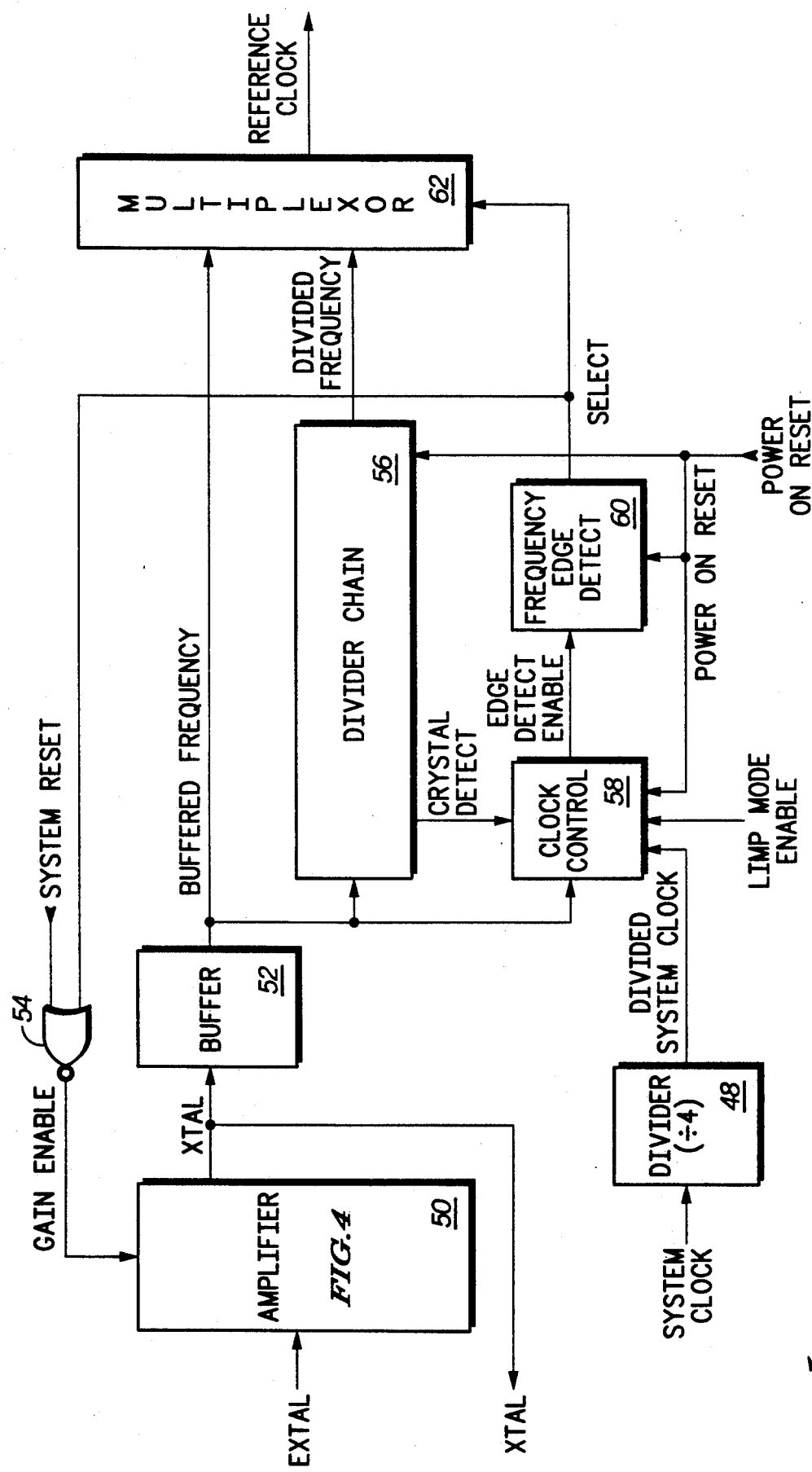
FIG. 3 illustrates in partial block diagram form an oscillator generator and amplifier of the clock generator of FIG. 2.

FIG. 3 illustrates oscillator generator and amplifier 40 of FIG. 2. The basic components of this apparatus are a divider 48, an amplifier 50, a buffer 52, a NOR gate 54, a divider chain 56, a clock control circuit 58, a frequency edge detect 60, and a multiplexor 62.

The EXTAL signal is provided to an oscillator input of amplifier 50 and a GAIN ENABLE signal is provided to a control input of amplifier 50. Generation of the GAIN ENABLE signal will be subsequently discussed in further detail.

Amplifier 50 is coupled to an input of buffer 52 to provide the XTAL signal. Additionally, amplifier 50 also provides the XTAL signal to an input of oscillator crystal 11. Buffer 52 subsequently provides a BUFFERED FREQUENCY signal to a first input of multiplexor 62, a first input of divider chain 56, and a first input of clock control circuit 58.

The SYSTEM CLOCK signal is provided to an input of divider 48. Subsequently, divider 48 is coupled to a second input of clock control circuit 58 to provide a signal labelled "DIVIDED SYSTEM CLOCK." Similarly, the POR signal is provided to a second input of divider chain 56, a first input of frequency edge detect 60, and a third input of clock control circuit 58. The LIMP MODE ENABLE signal is provided to a fourth input of clock control circuit 58.

In response to each of the BUFFERED FREQUENCY and POR signals, divider chain 56 divides the BUFFERED FREQUENCY signal by eight to provide a DIVIDED FREQUENCY signal at a lower frequency. In this implementation of the claimed invention, divider chain 56 has a divide ratio of eight to divide a four megahertz oscillator input down to a frequency of thirty-two kilohertz for use by data processing system 10.

Additionally, divider chain 56 uses a standard logic circuit (not shown) to test the BUFFERED FREQUENCY signal to determine whether an oscillator frequency is provided via the XTAL signal. An output of the standard logic circuit provides a CRYSTAL DETECT signal to a fifth input of clock control circuit 58 to indicate whether the oscillator frequency is present.

Clock control circuit 58 provides a EDGE DETECT ENABLE signal to a second input of frequency edge detect 60 upon receipt of each of the BUFFERED FREQUENCY, DIVIDED SYSTEM CLOCK, LIMP MODE ENABLE, POR, and CRYSTAL DETECT signals. Frequency edge detect 60 subsequently provides a SELECT signal to a third input of multiplexor 62 and a first input of NOR gate 54. The SYSTEM RESET signal provides a second input to NOR gate 54.

NOR gate 54 asserts the GAIN ENABLE signal when either the SYSTEM RESET or SELECT signals is asserted. As was previously mentioned, the GAIN ENABLE signal is provided to amplifier 50.

Figure 4:
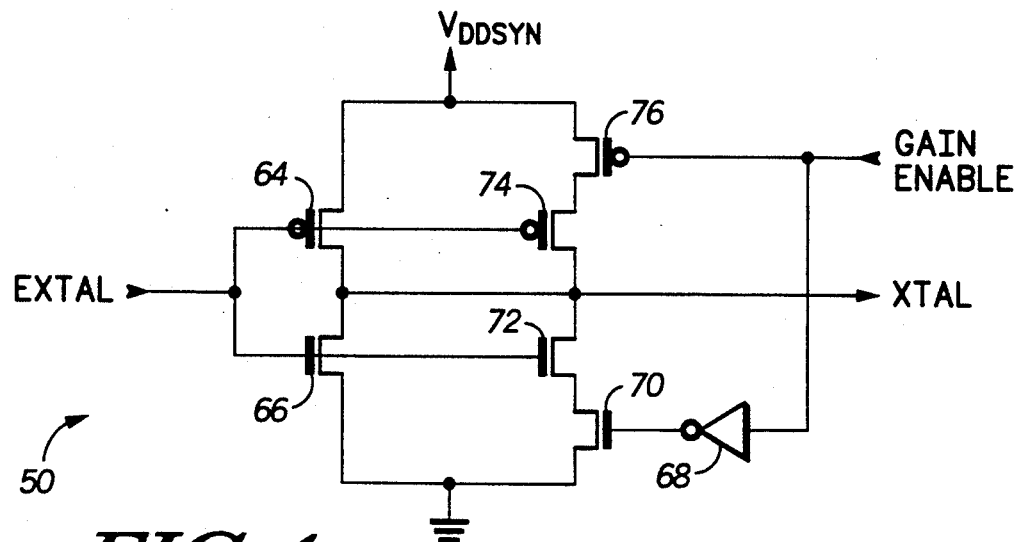
FIG. 4 illustrates in circuit diagram form an amplifier of the oscillator generator and amplifier of FIG. 3.

Amplifier 50 is able to dynamically provide either a high gain or a low gain depending on either the frequency of the EXTAL signal or the SYSTEM RESET signal. Amplifier 50 is illustrated in greater detail in FIG. 4. Amplifier 50 includes three p-type transistors, respectively labelled 64, 74, and 76. Additionally, amplifier 50 also has three n-type transistors, respectively labelled 66, 70, and 72. Amplifier 50 also includes an inverter 68.

The EXTAL signal is provided to a control electrode of each of transistor 64, transistor 66, transistor 72, and transistor 74. The $V_{DDSYN}$ signal is connected to a first current electrode of transistor 64 and transistor 76. The first current electrodes of transistor 66 and transistor 70 are connected to a ground reference voltage. A second current electrode of transistor 64 is connected to a second current electrode of transistor 66. Additionally, a second current electrode of transistor 64 is connected to a first current electrode of each of transistor 72 and transistor 74 to provide the XTAL signal.

The GAIN ENABLE signal is connected to a control input of transistor 76 and an input of inverter 68. An output of inverter 68 is connected to a control input of transistor 70. A second current electrode of transistor 70 is connected to a second current electrode of transistor 72. Similarly, a second current electrode of transistor 74 is connected to a second current electrode of transistor 76.

Assume that during operation, the GAIN ENABLE signal is negated to indicate that the XTAL signal has a frequency of thirty-two kilohertz and that a quick locking time is not necessary. Such a situation would occur if the user determined that power savings were of maximum importance, and that an external system using data processor 10 could tolerate a slow locking time.

In such a situation, a negated GAIN ENABLE signal would turn transistor 76 off. Similarly, the output of inverter 68 would not allow transistor 70 to be conductive. If neither transistor 70 nor transistor 76 is enabled, then neither transistor 72 nor transistor 74 may be enabled. Therefore, amplifier 50 may only amplify the XTAL signal by a gain factor which is a function of transistors 64 and 66. The amplified EXTAL signal is provided as the output labelled XTAL.

The gain supplied by transistors 72 and 74 is not applied until the GAIN ENABLE signal is asserted. NOR gate 54 asserts the GAIN ENABLE signal when either the SELECT signal or the SYSTEM RESET signal is asserted. If the GAIN ENABLE signal is asserted, transistors 70 and 76 are conductive. Subsequently, transistors 72 and 74 are used in addition to transistors 64 and 66 to amplify the EXTAL signal. Therefore, the EXTAL signal is amplified by a gain factor which is a function of transistors 64, 66, 70, 72, 74, and 76. Subsequently, the resulting XTAL signal is amplified even more when the GAIN ENABLE signal is asserted.

Figure 5:
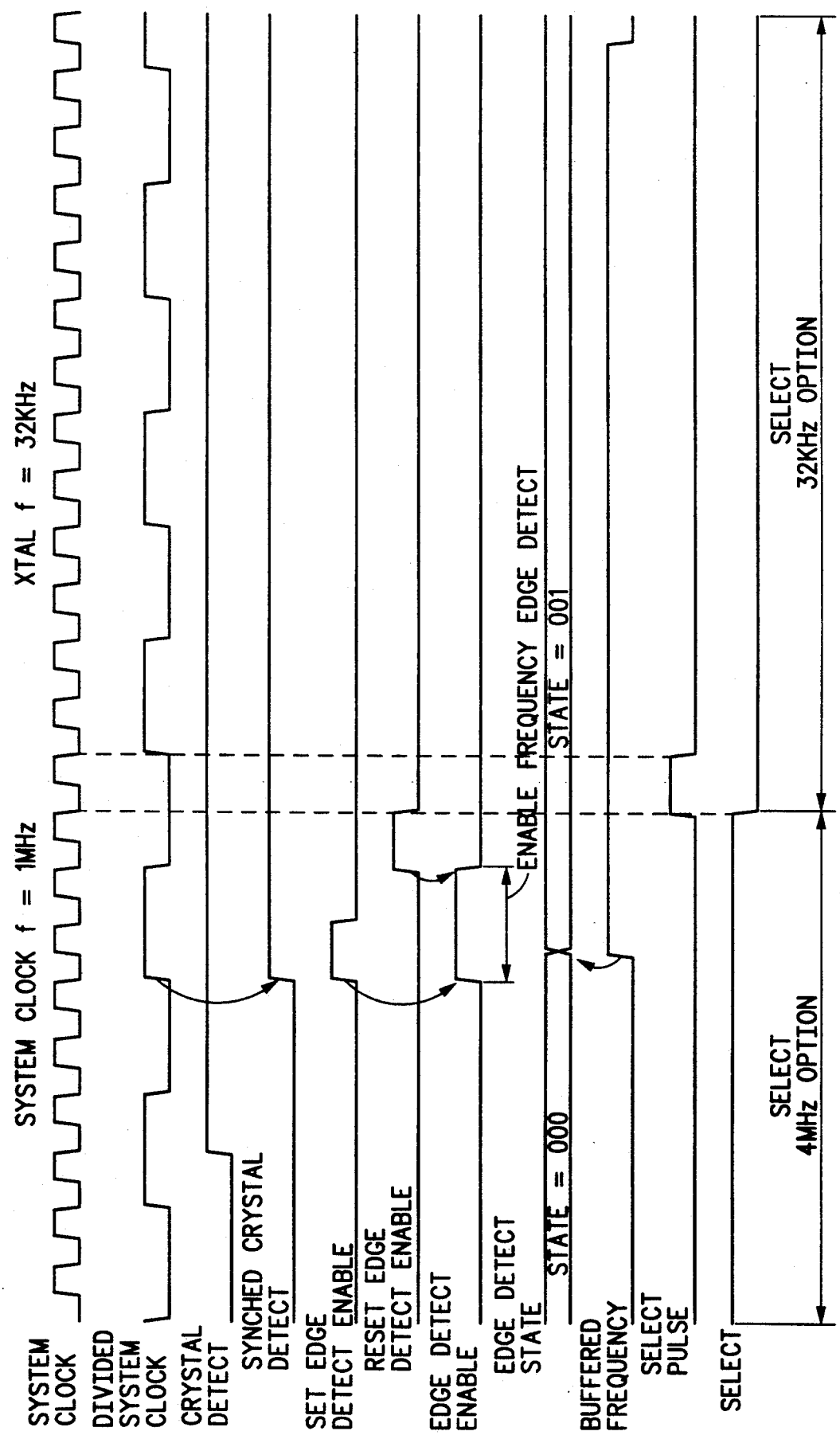
FIG. 5 illustrates in timing diagram form a first clock generation operation in oscillator generator and amplifier of FIG. 3.

As an example of the performance of clock generator 30, refer to FIG. 5. FIG. 5 illustrates a series of clock and control signals which enable clock generator 30 to provide the REFERENCE CLOCK signal at a predetermined frequency of thirty-two kilohertz with a faster than normal locking time when the XTAL input is only thirty-two kilohertz.

At the top of FIG. 5, a series of clock pulses representing the SYSTEM CLOCK signal is provided. As was previously mentioned, Loss of Crystal and Limp Mode Control circuit 36 of FIG. 2 enables charge pump and filter 42 to provide a limp mode frequency to VCO 46 if an EXTAL signal is not provided. Such is the case when data processor 10 is first powered up or is reset. The limp mode frequency is determined by a charge pump and filter 42. In the example described herein, the limp mode frequency provided to VCO 46 results in a SYSTEM CLOCK signal having a frequency of one megahertz. A frequency of the SYSTEM CLOCK signal is determined by a designer of clock generator 30 to fully meet the needs of data processor 10.

Divider 48 subsequently divides the frequency of the SYSTEM CLOCK signal by four to provide the DIVIDED SYSTEM CLOCK signal to clock control circuit 58.

Concurrently, during either a system start-up or reset operation, an EXTAL signal is provided to amplifier 50 of oscillator generator and amplifier 40. The GAIN ENABLE signal is also provided to amplifier 50. If the GAIN ENABLE signal is asserted, amplifier 50 amplifies the EXTAL signal to provide the XTAL signal with a high gain. If the XTAL signal has a high gain, clock generator 30 is able to provide the REFERENCE CLOCK signal in a substantially shorter amount of time. However, the fast locking time requires more power consumption as additional logic circuitry (transistors 70, 72, 74, and 76 of FIG. 4) must be powered to provide greater amplification and higher gain.

The GAIN ENABLE signal may be asserted by either the SYSTEM RESET signal or the SELECT signal. Typically, the SYSTEM RESET signal is only asserted at system start-up when data processor 10 is reset. If either signal is asserted, NOR gate 54 asserts the GAIN ENABLE signal. Therefore, during system start-up in this embodiment of the invention, the SYSTEM RESET signal is asserted. If the EXTAL signal has a low frequency, such as thirty-two kilohertz, the SYSTEM RESET signal enables amplifier 50 to provide the XTAL signal at a higher amplification which will substantially shorten the time necessary to generate the SYSTEM CLOCK signal. Generation of the SELECT signal will be discussed later in further detail. Assume in this example, that the SYSTEM RESET signal is asserted at system start-up, and the XTAL signal is provided at a same frequency of thirty-two kilohertz, but with a higher gain.

Subsequently, the XTAL signal is buffered and strengthened by buffer 52 to provide the BUFFERED FREQUENCY signal at the thirty-two kilohertz frequency. As was previously described, the BUFFERED FREQUENCY signal is provided to multiplexor 62, divider chain 56, and clock control circuit 58. In divider chain 56, the BUFFERED FREQUENCY signal is divided to a frequency of thirty-two kilohertz. A divide ratio used by divider chain 56 is determined by a frequency of oscillator crystal 11. Therefore, it is useful for crystal oscillator 11 to provide the EXTAL frequency which is divisible by two to the thirty-two kilohertz. In other systems in which the REFERENCE CLOCK signal might have a different frequency, the frequency of oscillator crystal 11 must be carefully chosen for ease of computation and for minimal logic circuitry. Additionally, divider chain 56 tests the BUFFERED FREQUENCY signal to determine if a signal is actually being provided by the XTAL signal. Depending on the results of this test, the CRYSTAL DETECT signal is either asserted or negated. As illustrated in FIG. 5, the CRYSTAL DETECT signal is asserted to indicate that the XTAL signal is present. The CRYSTAL DETECT signal is subsequently provided to clock control circuit 58. Clock control circuit 58 then synchronizes the CRYSTAL DETECT signal to the DIVIDED SYSTEM CLOCK signal to ensure proper operation of clock generator 30. The synchronized CRYSTAL DETECT signal is labelled "SYNCHED CRYSTAL DETECT."

Clock control logic 58 asserts a SET EDGE DETECT signal on a rising edge of the SYNCHED CRYSTAL DETECT signal. Upon receipt of each of the BUFFERED FREQUENCY, DIVIDED SYSTEM CLOCK, CRYSTAL DETECT, LIMP MODE ENABLE, and POR signals, clock control circuit 58 asserts the EDGE DETECT ENABLE signal on a rising edge of the SET EDGE DETECT signal. The EDGE DETECT ENABLE signal is subsequently negated on a rising edge of a RESET EDGE DETECT ENABLE signal provided by clock control circuit 58.

The EDGE DETECT ENABLE signal enables frequency edge detect 60 to count a number of rising edges of the BUFFERED FREQUENCY signal. In FIG. 5, a value counted by frequency edge detect 60 is indicated by an EDGE DETECT STATE signal.

The value is then compared against a predetermined number to determine whether the BUFFERED FREQUENCY signal has a high or low frequency. A comparator (not shown) at the output of frequency edge detect 60 may be used to perform such a function. If the BUFFERED FREQUENCY signal has a low frequency, frequency edge detect 60 will only count a relatively small number of transitions. Similarly, if the BUFFERED FREQUENCY signal has a high frequency, frequency edge detect 60 will count a higher number of transitions.

A SELECT PULSE signal is asserted on the falling edge of the RESET EDGE DETECT ENABLE signal to provide a control signal to evaluate the contents of frequency edge detect circuit 60. If the BUFFERED FREQUENCY signal is a low frequency, frequency edge detect 60 negates the SELECT signal and provides it to multiplexor 62. The SELECT signal is always asserted when data processor 10 is either reset or during system start-up. Therefore, if the frequency of crystal oscillator is thirty-two kilohertz, the SELECT signal must be negated to enable amplifier 50 to provide a correct gain factor. Additionally, the SELECT signal enables multiplexor 62 to select a correct signal as the REFERENCE CLOCK signal.

Subsequently, multiplexor 62 selects the BUFFERED FREQUENCY signal as an output, rather than the DIVIDED FREQUENCY signal. The BUFFERED FREQUENCY signal is provided as the REFERENCE CLOCK signal to a remaining portion of clock generator 30 such that the phase lock loop operation previously described may be performed.

If the BUFFERED FREQUENCY had been a high frequency, the SELECT signal is asserted to enable multiplexor 62 to provide the DIVIDED FREQUENCY signal as the REFERENCE CLOCK signal. In either case, a REFERENCE CLOCK signal having a same predetermined frequency would be provided to a remaining portion of clock generator 30. In the example described herein, the predetermined frequency is thirty-two kilohertz.

Figure 6:
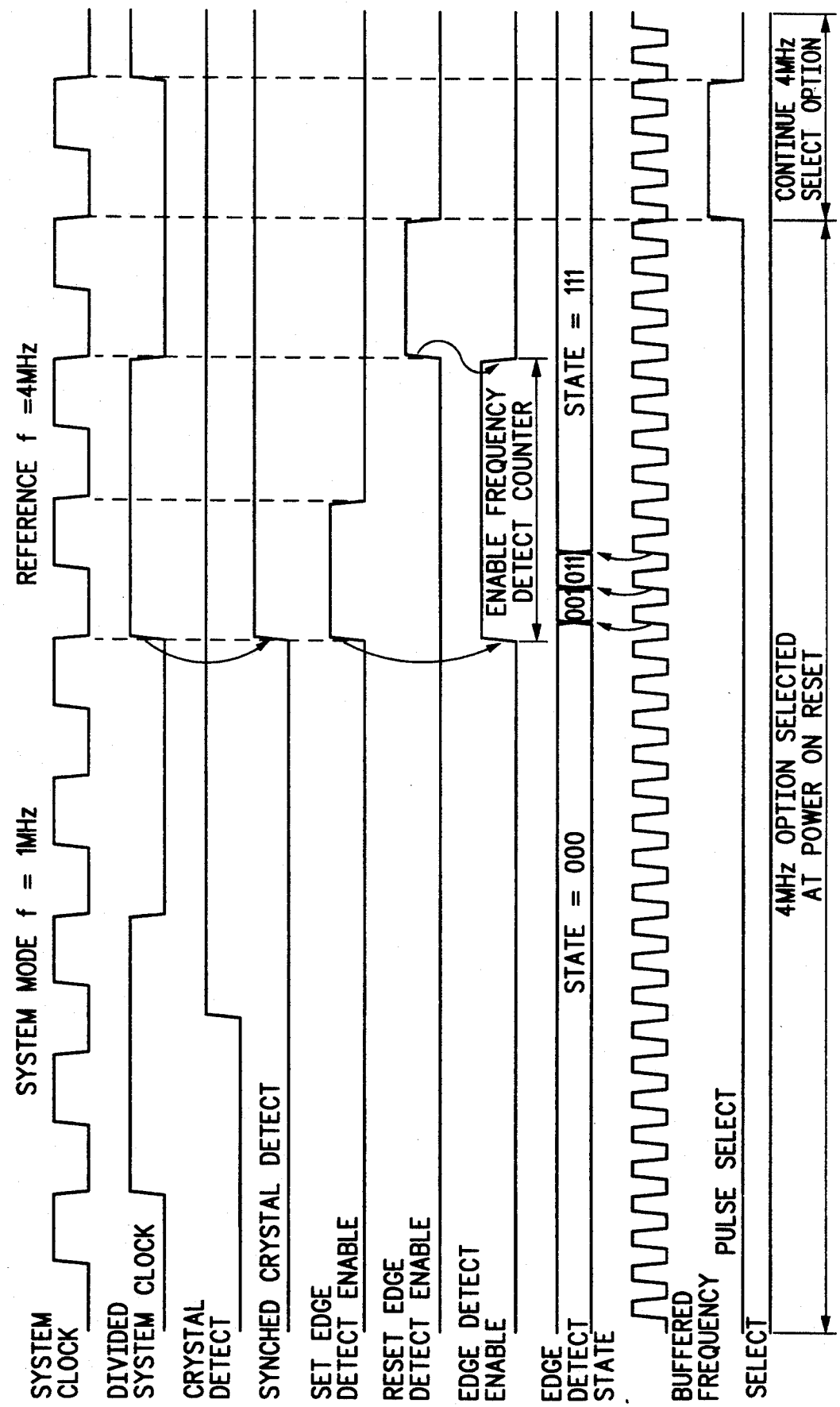
FIG. 6 illustrates in timing diagram form a second clock generation operation in oscillator generator and amplifier of FIG. 3.

FIG. 6 illustrates a series of clock and control signals which enable clock generator 30 to provide the REFERENCE CLOCK signal at a predetermined frequency of thirty-two kilohertz when the frequency of the EXTAL signal is four megahertz.

As in FIG. 5, FIG. 6 illustrates a series of clock pulses representing the SYSTEM CLOCK signal. In the example shown in FIG. 6, the SYSTEM CLOCK signal has a frequency of four megahertz.

As was previously described, divider 48 subsequently divides the frequency of the SYSTEM CLOCK signal by four to provide the DIVIDED SYSTEM CLOCK signal to clock control circuit 58. Concurrently, an EXTAL signal is provided to amplifier 50 of oscillator generator and amplifier 40. The GAIN ENABLE signal is also provided to amplifier 50.

The GAIN ENABLE signal may be asserted by either the SYSTEM RESET signal or the SELECT signal. Generation of the SELECT signal will be discussed later in further detail. Assume in this example, that the SELECT signal is asserted at system start-up, and the XTAL signal is provided with a high gain.

Subsequently, the XTAL signal is buffered and strengthened by buffer 52 to provide the BUFFERED FREQUENCY signal at the four megahertz frequency. As was previously described, the BUFFERED FREQUENCY signal is provided to multiplexor 62, divider chain 56, and clock control circuit 58. In divider chain 56, the BUFFERED FREQUENCY signal is divided to a frequency of thirty-two kilohertz. Additionally, divider chain 56 tests the BUFFERED FREQUENCY signal to determine if a signal is actually being provided by the XTAL signal. Depending on the results of this test, the CRYSTAL DETECT signal is either asserted or negated. As illustrated in FIG. 6, the CRYSTAL DETECT signal is asserted to indicate that the XTAL signal is present. The CRYSTAL DETECT signal is subsequently provided to clock control circuit 58. Clock control circuit 58 then synchronizes the CRYSTAL DETECT signal to the DIVIDED SYSTEM CLOCK signal to ensure proper operation of clock generator 30. The synchronized CRYSTAL DETECT signal is labelled "SYNCHED CRYSTAL DETECT."

Clock control logic 58 asserts a SET EDGE DETECT signal on a rising edge of the SYNCHED CRYSTAL DETECT signal. Upon receipt of each of the BUFFERED FREQUENCY, DIVIDED SYSTEM CLOCK, CRYSTAL DETECT, LIMP MODE ENABLE, and RESET EDGE DETECT ENABLE signals, clock control circuit 58 asserts the EDGE DETECT ENABLE signal on a rising edge of the SET EDGE DETECT signal. The EDGE DETECT ENABLE signal is subsequently negated on a rising edge of a RESET EDGE DETECT ENABLE signal provided by clock control circuit 58.

The EDGE DETECT ENABLE signal enables frequency edge detect 60 to count a number of rising edges of the BUFFERED FREQUENCY signal. In FIG. 6, a value counted by frequency edge detect 60 is indicated by an EDGE DETECT STATE signal. When the SYSTEM CLOCK signal has a frequency, the binary value of the EDGE DETECT STATE signal is seven.

The value is then compared against a predetermined number to determine whether the BUFFERED FREQUENCY signal has a high or low frequency. A comparator (not shown) at the output of frequency edge detect 60 may be used to perform such a function. If the BUFFERED FREQUENCY signal has a low frequency, frequency edge detect 60 will only count one transition. Similarly, if the BUFFERED FREQUENCY signal has a high frequency, frequency edge detect 60 will count seven transitions.

A SELECT PULSE signal is asserted on the falling edge of the RESET EDGE DETECT ENABLE signal to provide a control signal to evaluate the contents of frequency edge detect circuit 60. Because the BUFFERED FREQUENCY signal is a high frequency of four megahertz, frequency edge detect 60 does not negate the SELECT signal. The SELECT signal is provided to multiplexor 62 such that the DIVIDED FREQUENCY signal is provided as an output. As described in FIG. 5, the REFERENCE CLOCK signal has a frequency of thirty-two kilohertz regardless of the frequency of oscillator crystal 11. The BUFFERED FREQUENCY signal is provided as the REFERENCE CLOCK signal to a remaining portion of clock generator 30 such that the phase lock loop operation previously described may be performed.

By providing the SELECT signal to indicate whether the EXTAL signal is a high or low frequency signal, oscillator generator and amplifier 40 is able to dynamically provide the SYSTEM CLOCK signal at a frequency of thirty-two kilohertz with no interaction from the user. The SELECT signal enables multiplexor 62 to choose either the BUFFERED FREQUENCY signal or the DIVIDED FREQUENCY signal. If the EXTAL signal is provided by a low frequency oscillator (not shown) equal to the desired frequency of data processor 10, the REFERENCE CLOCK signal is provided by a buffered form of the XTAL signal, the BUFFERED FREQUENCY signal. Similarly, if the EXTAL signal is provided by a high frequency oscillator, the frequency of the EXTAL signal must be divided to provide the REFERENCE CLOCK signal at the desired frequency of data processor 10.

The SELECT signal is also provided to NOR gate 54 to dynamically assert or negate the GAIN ENABLE signal. If the EXTAL signal has a low frequency, a high gain is not necessary. Therefore, additional circuitry typically required to amplify a high frequency may be turned off to conserve power consumption. The user of the system is not required to interface with clock generator 30 through either software or hardware circuitry to enable amplifier 50 to provide the proper gain factor. Rather, clock control circuit 58 and frequency edge detect 60 determine a frequency of the EXTAL signal, and provide the SELECT signal to dynamically enable amplifier 50 to provide the correct gain factor.

An additional feature of clock generator 30 allows the SYSTEM RESET signal to be asserted when a fast lock time is desired with a low frequency oscillator. The SYSTEM RESET signal, however, is only asserted when data processor 10 is reset or is powered up. The SYSTEM RESET signal enables NOR gate 54 to assert the GAIN ENABLE signal, such that the low frequency EXTAL signal is further amplified such that the REFERENCE CLOCK signal may be generated more quickly.

In summary, clock generator 30 provides a very flexible circuit and method for providing a system clock to a data processor. A user may provide either a high or low frequency oscillator depending on requirements of the system in which the clock generator is used. The user is not required to interface with the clock generator; all decisions are made dynamically by the oscillator generator and amplifier circuit to effectively and efficiently use a provided oscillator signal. Additionally, the user is also able to achieve fast lock times with a low frequency oscillator by providing a single control signal, herein referred to as the SYSTEM RESET signal.

The clock generator circuit, therefore, allows three modes of operation with only a single control signal. In a first mode, a low frequency oscillator may be used to provide a system clock with relatively little power consumption. In a second mode, a high frequency oscillator may be used to substantially decrease a period of locking time and to provide a stable system clock in a relatively short amount of time. Lastly, in a third mode, the user may also shorten the locking time period of a low power frequency oscillator by asserting a single control signal to enable more amplification of the low power frequency.

The implementation of the invention described herein is provided by way of example only. However, many other implementations may exist for executing the function described herein. For example, rather than just choosing between a high and a low frequency, a plurality of oscillators with varying frequencies could be implemented with the addition of more control and logic circuitry. Additionally, divider 48 may divide frequency by any amount determined by the user. In this embodiment of the invention, the SYSTEM CLOCK signal was divided by four to be compatible with the desired range of frequencies from thirty-two kilohertz to four megahertz. Should a user decide to provide oscillators having a different range of frequencies, divider 48 will divide by a different number. For example, if a user desired to choose between oscillators ranging from sixty-four kilohertz to thirty-two megahertz, divider 48 would divide by eight, rather than four. Similarly, more than one divider 48 could be implemented to broaden a range of possible oscillator frequencies. Additionally, although described herein in a phase lock loop circuit, oscillator generator and amplifier 40 may be implemented in a non-phase lock loop system having a predetermined frequency.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. An integrated circuit clock signal generator for receiving a first reference signal at a first frequency and a second reference signal at a second frequency, the integrated circuit clock signal generator providing a first clock signal, the generator further comprising:
    amplifier means for receiving and amplifying the first reference signal to provide an amplified signal;
    first logic means coupled to the amplifier means for processing the amplified signal to provide a second clock signal having a third frequency;
    control means having a first input for receiving the second reference signal and a second input for receiving the amplified signal, the control means processing each of the amplified signal and second reference signal to provide a first control signal; and
    selector means coupled to the amplifier means, the first logic means, and the control means for providing the first clock signal at either the first frequency or the third frequency in response to the first control signal.

2. The integrated circuit clock signal generator of claim 1 wherein the first control signal indicates a value of the first frequency of the first reference signal.

3. The integrated circuit clock signal generator of claim 1 wherein the amplifier means further comprises:
    first gain means for receiving and amplifying the first reference signal by a predetermined gain factor; and
    second gain means coupled to the first gain means, the second gain means selectively further amplifying the first reference signal in response to the first control signal.

4. The integrated circuit clock signal generator of claim 1 wherein the control means is further comprised of:
    a first detector circuit coupled to the amplifier means for detecting a presence of the amplified signal, the first detector circuit providing a second control signal to indicate the presence of the amplified signal.

5. The integrated circuit clock signal generator of claim 4 wherein the control means is further comprised of:
    a second divider circuit for dividing the second reference signal to provide a divided frequency signal;
    clock control means for providing a detect enable signal in response to the divided frequency signal and the second control signal; and
    a second detector circuit coupled to the clock control means for receiving the detect enable signal, the second detector circuit detecting a number of transitions of the amplified signal in response to the detect enable signal, the second detector circuit providing the first control signal in response to the number of transitions.

6. The integrated circuit clock signal generator of claim 1 wherein the first logic means is a first divider circuit, the first divider circuit dividing the amplified signal to provide the second clock signal at the third frequency.

7. The integrated circuit clock signal generator of claim 1 wherein the third frequency of the second clock signal is less than the first frequency of the first reference signal.

8. The integrated circuit clock signal generator of claim 1 further comprising:
   second logic means for providing an amplifier enable signal to enable the amplifier means to amplify the first reference signal by a predetermined gain factor in response to both the first control signal and a third control signal, wherein the third control signal indicates either a reset or a system start-up operation.

9. A method for generating a first clock signal having a first frequency comprising the steps of:
   receiving a first reference signal at a second frequency;
   amplifying the first reference signal by a predetermined gain factor to provide an amplified signal at the second frequency;
   dividing the second frequency of the amplified signal to provide a divided signal at a third frequency, the third frequency being less than the second frequency;
   comparing the first reference signal having the second frequency to a second reference signal having a fourth frequency to provide a first control signal; and
   providing the first clock signal at either the second frequency or the third frequency in response to a value of the first control signal.

10. The method of claim 9 wherein the step of amplifying the reference signal further comprises the steps of:
    amplifying the first reference signal by a predetermined gain factor to provide an intermediate amplified signal; and
    selectively further amplifying the intermediate amplified signal in response to the first control signal to provide the amplified signal.

11. The method of claim 10 further comprising the steps of:
    detecting a presence of the amplified signal; and
    providing a second control signal to indicate the presence of the amplified signal.

12. The method of claim 11 further comprising the steps of:
    dividing the first clock signal to provide a divided frequency;
    providing a detect enable signal in response to the divided frequency and the second control signal; and
    detecting a number of transitions of the amplified signal in response the detect enable signal, the value of the first control signal being determined by the number of transitions of the amplified signal.

13. The method of claim 9 further comprising the step of:
    providing an amplifier enable signal to enable the amplifier means to amplify the first reference signal by a predetermined gain factor in response to both the first control signal and a third control signal, wherein the third control signal indicates either a reset or a system start-up operation.

14. The method of claim 9 wherein the step of comparing the first reference signal is further comprised of providing the first control signal to indicate a value of the second frequency of the amplified signal.

15. A phase lock loop circuit for generating a system clock signal in response to an oscillator input, comprising:
    a comparator having a first input for receiving a reference signal, the comparator also having a second input for receiving a divided system clock signal, the comparator providing an error signal indicating a difference between the reference signal and the divided system clock signal;
    a filter means for receiving the error signal and providing a first control signal;
    a voltage controlled oscillator means for providing the system clock signal in response to the first control signal;
    a divider means for dividing the system clock signal to provide the divided system clock signal to the second input of the comparator;
    wherein the improvement comprises a clock generator means, the clock generator means comprising:
    amplifier means for receiving and amplifying the oscillator input to provide an amplified signal;
    first logic means coupled to the amplifier means for processing the amplified signal to provide a first clock signal;
    control means having a first input for receiving the system clock signal and a second input for receiving the amplified signal, the control means processing each of the system clock signal and the amplified signal to provide a second control signal; and
    a multiplexor coupled to the amplifier means, the first logic means, and the control means for providing either the amplified signal or the first clock signal as the reference signal in response to the second control signal.

16. The phase lock loop circuit of claim 15 wherein the amplifier means further comprises:
    first gain means for receiving and amplifying the oscillator input by a predetermined gain factor; and
    second gain means coupled to the first gain means, the second gain means selectively further amplifying the oscillator input in response to the second control signal.

17. The phase lock loop circuit of claim 15 wherein the control means is further comprised of:
    a first detector circuit coupled to the amplifier means for detecting a presence of the amplified signal, the first detector circuit providing a third control signal to indicate the presence of the amplified signal;
    a second divider circuit for dividing the system clock signal to provide a divided frequency signal;
    clock control means for providing a detect enable signal in response to the divided frequency signal and the third control signal; and
    a second detector circuit coupled to the clock control means for receiving the detect enable signal, the second detector circuit detecting a number of transitions of the amplified signal in response to the detect enable signal, the second detector circuit providing the second control signal in response to the number of transitions.

18. The phase lock loop circuit of claim 15 wherein the second control signal indicates a frequency of the amplified signal.

19. The phase lock loop circuit of claim 15 wherein the first logic means is a first divider circuit, the first divider circuit dividing the amplified signal to provide the first clock signal.

20. The phase lock loop circuit of claim 15 further comprising:

second logic means for providing an amplifier enable signal to enable the amplifier means to amplify the oscillator input by a predetermined gain factor in response to both the second control signal and a fourth control signal, wherein the fourth control signal indicates either a reset or a system start-up operation.

21. An integrated circuit clock signal generator, comprising:

an oscillator having an output;

an amplifier having a first input coupled to the oscillator and an output;

a divider having an input coupled to the amplifier and a divided output;

a clock control circuit having a first input coupled to the amplifier, a second input coupled to the divider, and a third input coupled to an external control signal, the clock control circuit having an output;

a frequency detector having a first input coupled to the clock control circuit and a second input coupled to the external control signal, the frequency detector having an output; and a multiplexor having a first input coupled to the amplifier, a second input coupled to the divider, and a third input coupled to the frequency detector, the multiplexor having an output.

* * * * *